United States Patent
La Rosa et al.

(10) Patent No.: US 9,825,186 B2
(45) Date of Patent: Nov. 21, 2017

(54) READ PERFORMANCE OF A NON-VOLATILE MEMORY DEVICE, IN PARTICULAR A NON-VOLATILE MEMORY DEVICE WITH BURIED SELECTION TRANSISTOR

(71) Applicant: STMicroelectronics (Rousset) SAS, Rousset (FR)

(72) Inventors: Francesco La Rosa, Rousset (FR); Stephan Niel, Meylan (FR); Arnaud Regnier, Les Taillades (FR)

(73) Assignee: STMICROELECTRONICS (ROUSSET) SAS, Rousset (FR)

(*) Notice: Subject to any disclaimer, the term of this patent is extended or adjusted under 35 U.S.C. 154(b) by 0 days.

(21) Appl. No.: 15/365,433

(22) Filed: Nov. 30, 2016

(65) Prior Publication Data
US 2017/0278577 A1   Sep. 28, 2017

(51) Int. Cl.
*H01L 29/788* (2006.01)
*G11C 16/34* (2006.01)
(Continued)

(52) U.S. Cl.
CPC ...... *H01L 29/7889* (2013.01); *G11C 16/0466* (2013.01); *G11C 16/08* (2013.01);
(Continued)

(58) Field of Classification Search
CPC ..... G11C 16/3427; G11C 16/26; G11C 16/10; G11C 16/08; G11C 16/0466; H01L 27/11556; H01L 27/11582; H01L 27/1157; H01L 27/11524; H01L 29/792; H01L 29/788
See application file for complete search history.

(56) References Cited

U.S. PATENT DOCUMENTS 6,304,480 B1   10/2001   Schoellkopf
6,432,761 B1    8/2002   Gerber et al.
(Continued)

FOREIGN PATENT DOCUMENTS

EP   1059669 A1   12/2000
FR   3021803 A1   12/2015
JP   H05110108 A   4/1993

OTHER PUBLICATIONS

Takeuchi, K. et al., "A Negative $V_{th}$ Cell Architecture for Highly Scalable, Excellently Noise-Immune, and Highly Reliable NAND Flash Memories," IEEE Journal of Solid-State Circuits, vol. 34, No. 5, May 1999, 10 pgs.

Primary Examiner — J. H. Hur
Assistant Examiner — Ajay Ojha
(74) Attorney, Agent, or Firm — Seed Intellectual Property Law Group LLP

(57) ABSTRACT

The non-volatile memory device comprises memory cells each comprising a selectable state transistor having a floating gate and a control gate. The state transistor is of the depletion-mode type and is advantageously configured so as to have a threshold voltage that is preferably negative when the memory cell is in a virgin state. When the memory cell is read, a read voltage of zero may then be applied to the control gate and also to the control gates of the state transistors of all the memory cells of the memory device.

20 Claims, 8 Drawing Sheets

(51) Int. Cl.
*G11C 16/04* (2006.01)
*G11C 16/26* (2006.01)
*G11C 16/10* (2006.01)
*G11C 16/08* (2006.01)
*H01L 27/11556* (2017.01)
*H01L 27/11582* (2017.01)
*H01L 27/1157* (2017.01)
*H01L 27/11524* (2017.01)
*H01L 29/792* (2006.01)

(52) U.S. Cl.
CPC .............. *G11C 16/10* (2013.01); *G11C 16/26* (2013.01); *G11C 16/3427* (2013.01); *H01L 27/1157* (2013.01); *H01L 27/11524* (2013.01); *H01L 27/11556* (2013.01); *H01L 27/11582* (2013.01); *H01L 29/788* (2013.01); *H01L 29/792* (2013.01)

(56) References Cited

U.S. PATENT DOCUMENTS

| | | |
|---|---|---|
| 6,518,126 B2 | 2/2003 | Wu et al. |
| 6,580,641 B2 | 6/2003 | Wu et al. |
| 2002/0175394 A1 | 11/2002 | Wu et al. |
| 2003/0086296 A1 | 5/2003 | Wu et al. |
| 2006/0262602 A1* | 11/2006 | Nazarian ............ G11C 16/0483 365/185.17 |
| 2007/0195595 A1 | 8/2007 | Seo et al. |
| 2012/0201079 A1 | 8/2012 | Shibata |
| 2013/0228846 A1* | 9/2013 | La Rosa ............ H01L 29/7889 257/321 |
| 2015/0348981 A1 | 12/2015 | La Rosa et al. |
| 2016/0336070 A1 | 11/2016 | La Rosa et al. |

* cited by examiner

READ PERFORMANCE OF A NON-VOLATILE MEMORY DEVICE, IN PARTICULAR A NON-VOLATILE MEMORY DEVICE WITH BURIED SELECTION TRANSISTOR

BACKGROUND

Technical Field

Various embodiments of the disclosure and their implementation relate to non-volatile memory devices, notably those comprising buried selection transistors and, more particularly, the improvement of the read performance of such devices by reducing, or even eliminating, the stress induced in the floating gate of the state transistor of a memory cell during an operation for reading this memory cell.

Description of the Related Art

A non-volatile memory cell, whether it is of the electrically erasable and programmable (EEPROM) type or else of the type with vertical selection transistor, comprises a state transistor with a floating gate selectable by means of a selection transistor connected in series with the state transistor.

The logical value of a bit stored in such a memory cell is represented by the value of the threshold voltage of the floating gate transistor.

The programming or the erasing of a floating gate transistor consists of the injection or the extraction of the electrical charges into/from the gate of the transistor by tunnel effect (Fowler-Nordheim effect) or by injection of hot electrons by means of high voltage(s).

Furthermore, the reading of such a memory cell may be carried out by applying a read voltage to the control gate of the floating gate state transistor, together with a positive voltage to the bit line connected to the drain of this floating gate transistor.

However, when such a read voltage is applied to the control gate of the state transistor, the electric field in the floating gate is modified resulting in a stress, which 'read stress' may lead to a 'read disturb' phenomenon that can result in a modification of the logical value of the stored bit.

BRIEF SUMMARY

One embodiment of the disclosure aims to improve the performance characteristics of a non-volatile memory device during a read operation, by greatly reducing, or even eliminating, the read stress so as to minimize, or even eliminate, the risk of occurrence of a 'read disturb' phenomenon.

According to one aspect, a non-volatile memory device is provided, comprising at least one memory cell comprising a selectable state transistor having a charge-trapping region and a control gate. In one embodiment, the state transistor is a floating gate transistor and the charge-trapping region is a floating gate. In another embodiment, the state transistor is a SONOS transistor and the charge-trapping region is a silicon nitride layer.

According to a general feature of this aspect, the state transistor is of the depletion-mode type and advantageously configured to be conducting when the memory cell is in a virgin state (in other words when no charge is present in the floating gate) and when a control voltage of zero is applied to the control gate.

Since the state transistor is of the depletion-mode type, the 'normally on' nature of the state transistor when the memory cell is in a virgin state and when a voltage of zero is applied to the control gate (control gate connected to ground), and consequently to the charge-trapping region by capacitive effect, is linked to the value of its threshold voltage in the virgin state of the memory cell, which can for example be chosen to be negative or substantially zero.

Furthermore, aside from a virgin state, the memory cell can have a first state, for example an erased state, corresponding to a first logical value of the stored bit, and a second state, for example a programmed state, corresponding to a second logical value of the stored bit.

Moreover, the threshold voltages of the state transistor in these two states of the memory cell fall on either side of the threshold voltage of the state transistor of the memory cell in the virgin state.

Thus, for example, in the first state of the memory cell, the threshold voltage of the state transistor is negative and lower than the threshold voltage of the state transistor of the memory cell in the virgin state, whereas in the second state of the memory cell, the threshold voltage of the state transistor is positive and higher than the threshold voltage of the state transistor of the memory cell in the virgin state.

It therefore becomes possible to apply a read voltage of zero to the control gate during a read operation. Indeed, with such a read voltage of zero, it is possible to differentiate the state of the memory cell, since the state transistor of a memory cell in its first state (erased cell for example) will be conducting since its threshold voltage will be lower than that of a virgin cell and it will be turned off in the presence of a memory cell in its second state (programmed cell for example) since the threshold voltage will now be positive.

So, since, in read mode, there is a voltage of zero on the control gate and hence on the charge-trapping region, there are no read stresses induced, which allows the risk of the appearance of the 'read disturb' phenomenon to be greatly reduced, or even eliminated.

Thus, according to another aspect, a non-volatile memory device is provided, comprising at least one memory cell comprising a selectable state transistor having a charge-trapping region and a control gate, the memory cell being designed to store a binary data value and capable of taking a first and a second state respectively corresponding to two logical values of the binary data value.

According to one general feature of this other aspect, the state transistor, of the depletion-mode type, is configured, when a control voltage of zero is applied to the control gate, so as to be conducting when the memory cell is in its first state and turned off when the memory cell is in its second state.

The memory device therefore advantageously comprises a read circuit configured for applying a read voltage of zero to the control gate during an operation for reading the memory cell, for example by connecting the control gate to ground.

However, the more a memory cell ages, the more the erased state of this cell approaches that of a memory cell in the virgin state.

Accordingly, in such a manner as to promote a reliable differentiation of the two erased and programmed states of the memory cell when it is read, a negative threshold voltage will be advantageously chosen for the state transistor of the memory cell in the virgin state.

Furthermore, this differentiation will be all the more reliable the more negative this threshold voltage is. In this regard, a threshold voltage less than or equal to −0.5 volts, for example in the range between −1 volt and −0.5 volts, could be chosen for the state transistor of the memory cell in the virgin state.

The channel of the state transistor is advantageously a channel implanted onto the surface of a substrate.

The depth of the implanted channel is preferably sufficiently shallow for the channel to be considered as remaining on the surface. Indeed, in certain cases, notably when being erased or programmed, the state transistor is in an OFF state, and if the depth of the channel is too deep, it will then be difficult to turn the state transistor off.

Those skilled in the art will be able to adjust the energy of implantation of the dopants in order to obtain a depth of the channel compatible with a transistor of the depletion-mode type, while at the same time allowing the latter to be readily turned off where necessary.

By way of example, the depth of the implanted channel is advantageously less than or equal to 100 nm.

The dose of dopants controls the threshold voltage of the state transistor.

Thus, in order to obtain a state transistor having a negative threshold voltage in the case of a virgin cell, the dose of dopants implanted can be in the range between $10^{12}$ atoms/$cm^2$ and $10^{14}$ atoms/$cm^2$. A threshold voltage is then obtained for a virgin cell in the range for example between −1 volt and −0.5 volts.

Any type of non-volatile memory device comprising a state transistor selectable by a selection transistor connected in series with this state transistor may benefit from the use of a depletion-mode state transistor, in particular a memory device of the EEPROM type.

However, it is particularly advantageous for the state transistor to be selectable by a vertical selection transistor connected in series with the state transistor.

Indeed, even if the disclosure is applicable to a planar architecture, in this case, it may be difficult to implant the channel of the state transistor without implanting the channel of the selection transistor so as to maintain a selection transistor with a low current in the OFF state (IOFF). Furthermore, even if the implantation of dopants is limited to the channel region situated under the charge-trapping region of the state transistor, the implantation could affect the effective length of the channel of the selection transistor owing to the lateral diffusion of the dopants.

In the case of a vertical selection transistor, in other words whose gate extends vertically into the substrate, such a difficulty is not encountered.

Such a memory device comprising memory cells using vertical selection transistors is for example described in the US patent application published under the number US 2013/0228846A1, which is incorporated by reference herein in its entirety.

More precisely, the memory plane of such a memory device comprises memory cells referred to as 'twin cells', in other words whose selection transistors have a common gate. These twin cells are furthermore connected to the same bit line.

Although it would be possible to equip these memory cells of such a device with state transistors of the depletion-mode type, the advantage gained in terms of reduction of the read stress only in fact concerns one of the two twin cells, in other words the one in the process of being read, because the other twin cell has to receive a non-zero read inhibit voltage on the control gate of its state transistor so as to avoid it being simultaneously read.

In contrast, this drawback is not found in a memory device whose memory plane also comprises twin cells with selection transistors having a buried common gate, but having an architecture of the 'double-bit-line' type, such as that described in U.S. patent application Ser. No. 14/980,853, which is incorporated by reference herein in its entirety.

In such a device, the memory plane comprises rows and columns of memory cells, and the columns of memory cells comprise pairs of twin memory cells, the two selection transistors of a pair of twin memory cells having a common gate.

Two bit lines per column of memory cells are also provided, and two twin adjacent memory cells of the same column are not connected to the same bit line, whereas two non-twin adjacent memory cells of the same column are connected to the same bit line.

Furthermore, gate control lines are connected to the control gates of the state transistors of the memory cells of the same row.

With such a memory plane and twin memory cell structure, a memory cell can be read without applying a read inhibit voltage to the twin memory cell.

For this reason, the read circuit can be advantageously configured to apply a read voltage of zero to the control gates of the state transistors of all the memory cells of the memory plane.

Furthermore, the memory cells of at least a part of a row may form a page and the read circuit may be configured to read the memory plane by page.

According to another aspect, a method is provided for reading a non-volatile memory cell comprising a selectable state transistor of the depletion-mode type having a charge-trapping region and a control gate and advantageously configured for exhibiting a negative threshold voltage when the memory cell is in a virgin state, the method comprising an application of a read voltage of zero to the control gate of the state transistor.

According to one embodiment in which the said memory cell belongs to a memory device comprising a memory plane comprising rows and columns of memory cells, the columns of memory cells comprising pairs of twin memory cells, the two selection transistors of a pair of twin memory cells having a common gate, two bit lines per column of memory cells, two twin adjacent memory cells of the same column not being connected to the same bit line and two non-twin adjacent memory cells of the same column being connected to the same bit line, and gate control lines connected to the control gates of the state transistors of the memory cells of the same row, the method furthermore comprises an application of a read voltage of zero to the control gates of the state transistors of all the memory cells of the memory plane.

According to one embodiment in which the memory cells of at least a part of a row form a page, the memory plane is read by page.

BRIEF DESCRIPTION OF THE SEVERAL VIEWS OF THE DRAWINGS

Other advantages and features of the disclosure will become apparent upon examining the detailed description of non-limiting embodiments and their implementation, and from the appended drawings in which.

DETAILED DESCRIPTION

Figure 1:
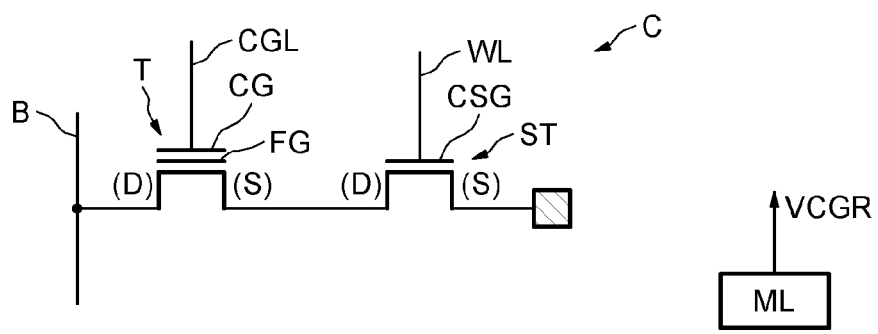
FIGS. 1 to 11 illustrate various embodiments of the disclosure and their implementation.

In FIG. 1, the reference C denotes a non-volatile memory cell, for example of the EEPROM type or else of the type with a buried vertical selection transistor.

More precisely, the memory cell C comprises a state transistor T comprising a floating gate FG on top of which is a control gate CG connected to a gate control line CGL. As is well known, the floating gate FG acts as a charge-trapping region that does not trap charge in a first logic state and traps charges in a second logic state.

The drain D of the state transistor T is connected to a bit line B, whereas the source of the state transistor T is connected to the drain of a selection transistor ST.

The selection transistor ST comprises a gate CSG connected to a word line WL.

The source S of the selection transistor ST is connected to a source line SL.

Figure 2:
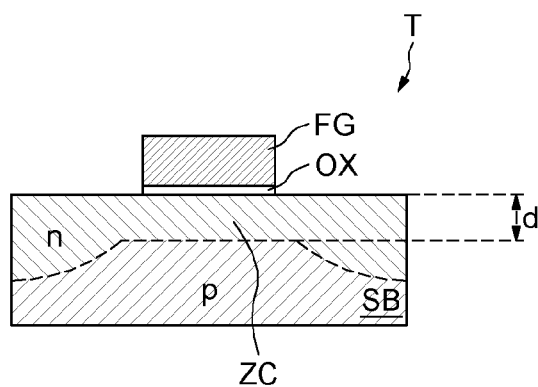

As illustrated in FIG. 2, the state transistor T is a depletion-mode transistor comprising an implanted channel ZC.

In the example illustrated here, the transistor T is a transistor of the NMOS type whose source, drain and channel regions are of the N type of conductivity and are formed within a substrate SB of the P type of conductivity. For the sake of simplification of the figure, only the floating gate FG of the state transistor T is shown here, separated from the channel region ZC by a gate oxide OX.

As is well known to those skilled in the art, the depletion-mode MOS transistor is conducting with no control voltage applied to the control gate of the state transistor (control gate connected to ground), and consequently to the floating gate by capacitive coupling. The state transistor T is therefore referred to as 'normally on'. On the other hand, the transistor T becomes less and less conducting as the control voltage present on the control gate increases in absolute value (becomes more and more negative) to finally turn off beyond a blocking voltage, as illustrated in FIG. 3.

Figure 3:
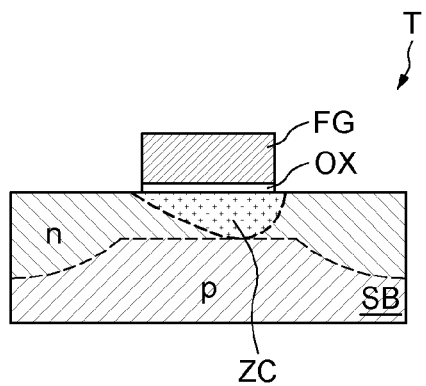

The channel ZC is advantageously a surface channel that, as illustrated in FIG. 3, is able to block the conduction of the channel by application of an appropriate control voltage to the control gate of the state transistor T.

The energy of implantation of the dopants defines the depth d of the channel. By way of example, this energy may be in the range between 5 keV and 100 keV then resulting in a thickness d of the order of 100 nm.

In the case of a channel with the N type of conductivity, the implanted dopants may for example be arsenic As, and the concentration of dopants determines the threshold voltage $V_{th0}$ of the transistor T of a memory cell in the virgin state. Here, the state transistor is configured to have such a threshold voltage $V_{th0}$ that is negative. For this purpose, a dose of implanted dopants in the range between $10^{12}$ atoms/$cm^2$ and $10^{14}$ atoms/$cm^3$ may be used.

With such a dose of dopants, a negative voltage $V_{th0}$ in the range for example between −1 volt and −0.5 volts can be obtained.

Figure 4:
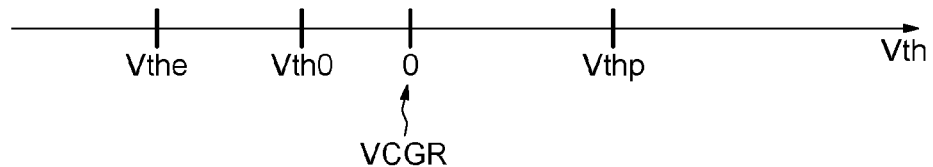

FIG. 4 shows schematically the various threshold voltages $V_{the}$, $V_{th0}$ and $V_{thp}$ respectively corresponding for example to erased, virgin and programmed memory cells.

In read mode, the read circuit ML (FIG. 1) is configured to apply a read voltage VCGR of zero to the control gate CG of the state transistor and for applying a positive voltage to the bit line B.

Since the transistor T is a depletion-mode transistor with a negative voltage $V_{th0}$, it is normally conducting for a virgin memory cell, in other words when no charge is present in the floating gate.

FIG. 4 also shows that a state transistor of an erased memory cell will be conducting, whereas the state transistor of a programmed memory cell will be turned off. Moreover, applying a voltage VCGR of zero to the control gate, and consequently to the floating gate FG of the state transistor, does not induce any read stress, which contributes to eliminating the risk of 'read disturb'.

The disclosure may be applied to a planar memory plane architecture with, however, the difficulty of providing an implantation of the channel of the state transistor that does not implant the channel of the selection transistor in such a manner as to be able to maintain a low current, for the selection transistor, in the OFF state ('IOFF')

However, even if the implantation is limited to the channel region of the state transistor, this implantation risks, even so, affecting the effective length of the selection transistor owing to the lateral diffusion of the dopants.

It is for this reason that it is particularly advantageous to use the characteristic of the depletion-mode state transistors in combination with a memory device whose selection transistors are vertical, in other words having a vertical gate buried in the substrate. One example of such a memory device is illustrated in FIG. 5.

Figure 5:
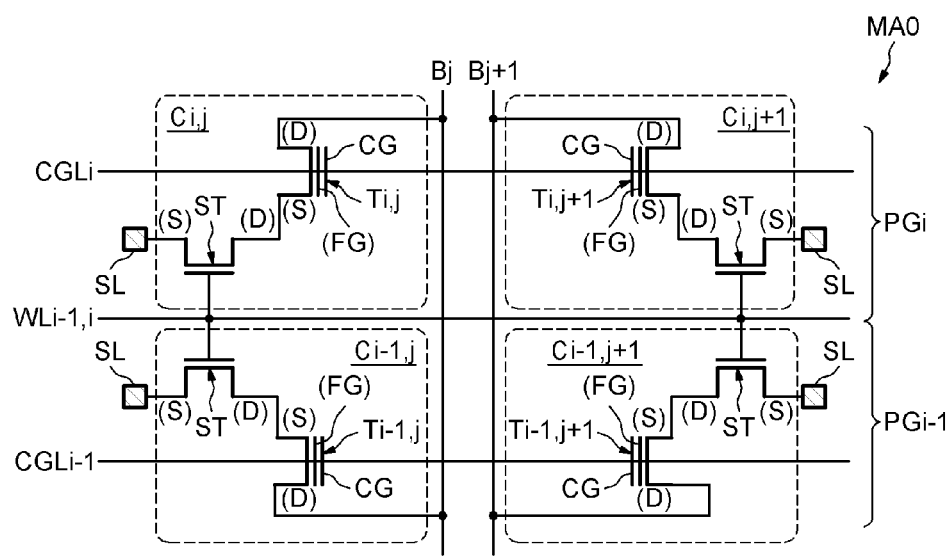

FIG. 5 shows a memory plane structure MA0 of a memory device comprising memory cells Ci,j, Ci,j+1, Ci−1,j, Ci−1,j+1 according to one embodiment of the present application. The memory plane structure MA0 is similar to the memory plane structure described in the patent application US 2013/0228846, except that the memory cells Ci,j, Ci,j+1, Ci−1,j, Ci−1,j+1 include respective state transistors Ti,j, Ti,j+1, Ti−1,j, Ti−1,j+1 like the state transistor T described above and shown in FIGS. 1-3. The memory cells Ci,j, Ci,j+1 of rank 'i' belong to a physical page PGi of the memory plane and are connected to a word line WLi−1,i and to a gate control line CGLi. The memory cells Ci−1,j, Ci−1,j+1 of rank 'i−1' belong to a physical page PGi−1 of rank 'i−1' of the memory plane and are connected to the word line WLi−1,i and to a gate control line CGLi−1. The memory cells Ci,j, Ci−1,j of rank 'j' are accessible in read and write mode via a bit line Bj and the memory cells Ci,j+1, Ci−1,j+1 of rank 'j−1' are accessible in read and write mode via a bit line Bj+1.

The drain regions (D) of the transistors Ti,j, Ti−1,j are connected to the bit line Bj and the drain terminals of the transistors Ti,j+1, Ti−1,j+1 are connected to the bit line Bj+1. The control gates CG of the transistors Ti,j, Ti,j+1 are connected to the gate control line CGLi and the control gates CG of the floating gate transistors Ti−1,j, Ti−1,j+1 are connected to the gate control line CGLi−1.

Each floating gate state transistor has its source terminal (S) connected to a source line SL via a respective selection transistor ST. The selection transistors ST of the memory cells Ci,j and Ci−1,j have a common selection gate CSG and the two memory cells are, for this reason, referred to as 'twin cells'. Similarly, memory cells Ci,j+1 and Ci−1,j+1 are twin memory cells and their selection transistors ST have a common selection gate CSG. Each selection gate CGS is a vertical gate buried in a substrate within which the memory plane MA0 is formed, the source line SL also being buried. These common selection gates CSG of twin memory cells are connected to the word line WLi−1,i.

Figure 6:
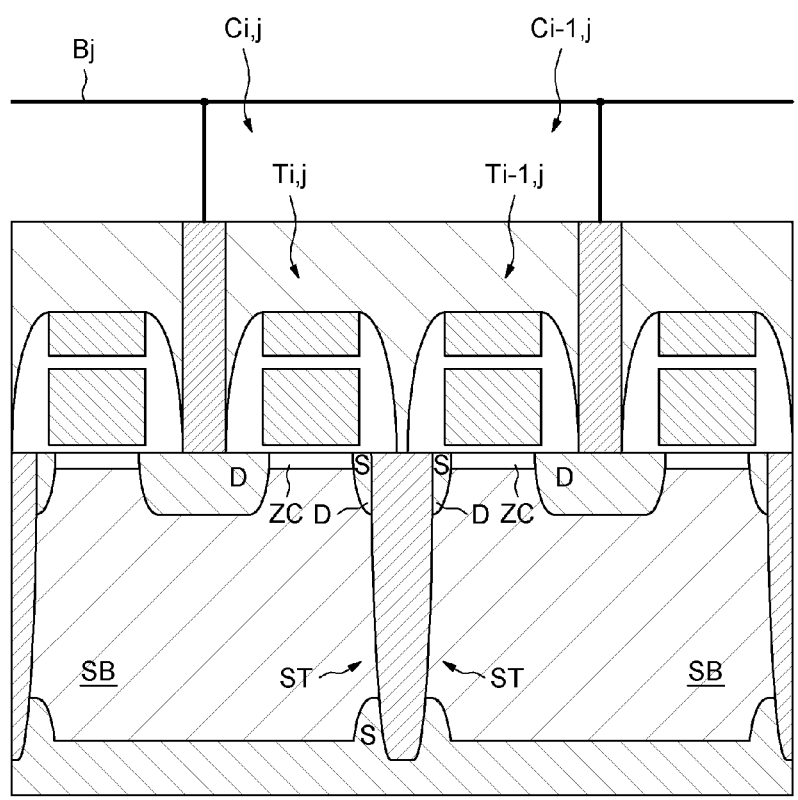

As illustrated in FIG. 6, each state transistor of the memory device of FIG. 5 is a depletion-mode transistor with an implanted channel ZC. The selection transistors ST connected to the two state transistors Ti,j and Ti−1,j each have a vertical channel and a buried vertical common selection gate. For this reason, the implantation of the channel ZC of each state transistor T is not detrimental to the characteristics of each selection transistor. It should be noted that, for the sake of simplifications of the figure, the contact allowing the buried common gate CSG to be connected to the corresponding word line is not shown.

Such memory cells may be erased or programmed via the channel, in other words by applying a positive erase voltage or negative programming voltage to the substrate causing the extraction of electrical charges from their floating gates or the injection of electrical charges into their floating gates, by Fowler-Nordheim effect or by injection of hot electrons.

More particularly, the erasing of a memory cell is implemented by combining the positive voltage applied to the substrate with a negative voltage applied to the control gate of its floating gate state transistor, while the control gate of the floating gate transistor of the twin memory cell receives a positive erase inhibit voltage preventing it from being simultaneously erased.

Similarly, the programming of a memory cell may be implemented for example by combining a negative voltage applied to the relevant bit line and to the substrate with a positive voltage applied to the control gate of its floating gate state transistor, while the control gate of the floating gate transistor of the twin memory cell receives a negative programming inhibit voltage preventing it being simultaneously programmed. The programming of the memory cells may also be provided by injection of hot electrons, by making a current flow in the bit lines.

Lastly, as previously indicated, the reading of a memory cell is implemented by applying a voltage of zero to the control gate CG of its state transistor, and a positive voltage to the corresponding bit line, while the twin memory cell, which is connected to the same bit line, receives a negative read inhibit voltage on the control gate of its state transistor preventing it from being simultaneously read.

The memory device including the memory plane structure MA1 includes a word line decoder capable of applying a read voltage of zero to a memory cell that is to be read, while at the same time applying a negative read inhibit voltage to its twin memory cell.

Furthermore, only the memory cells being read benefit from the absence of read stress, but not their twin cells which receive the negative read inhibit voltage.

It is for this reason that it is preferable to provide the use of depletion-mode state transistors in combination with a non-volatile memory device whose memory plane and twin memory cell structure allows a memory cell to be read without application of a negative read inhibit voltage to the twin memory cell, which will allow, as will be explained in more detail hereinafter, a voltage of zero to be able to be applied in read mode to the control gates of the state transistors of all the memory cells which will thus all benefit from the absence of read stress.

A twin memory cell structure referred to as a 'dual-bit-line structure' is described in U.S. patent application Ser. No. 14/980,853, which is incorporated herein by reference in its entirety.

Figure 7:
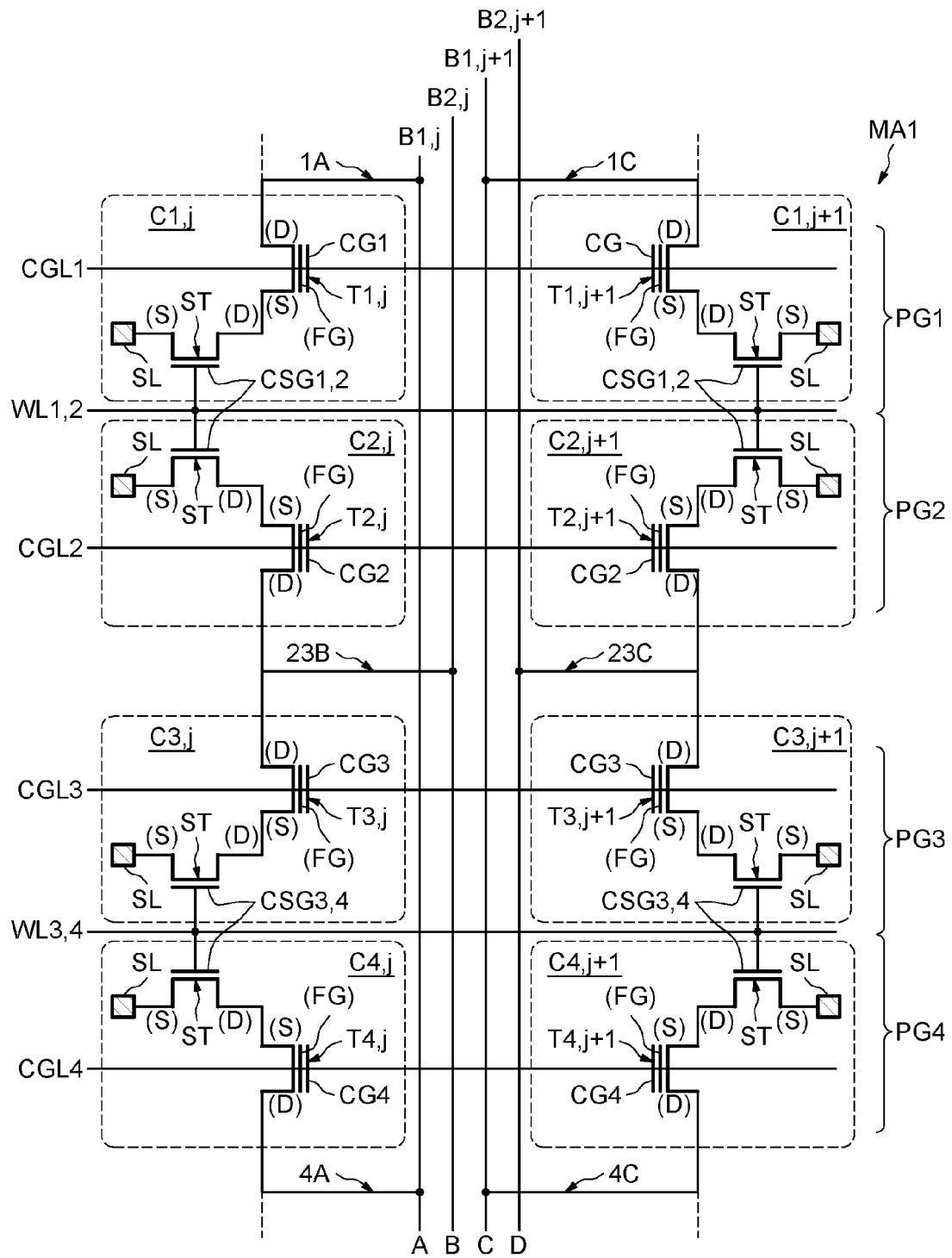

FIG. 7 is the electrical circuit diagram of one embodiment of a memory plane MA1, fabricated in a semiconductor substrate, according to one embodiment of the present application. The memory plane comprises rows and columns of memory cells, eight memory cells $C1,j$, $C2,j$, $C3,j$, $C4,j$, $C1,j+1$, $C2,j+1$, $C3,j+1$, $C4,j+1$ being represented here. Each memory cell comprises a floating gate state transistor (FG), respectively $T1,j$, $T2,j$, $T3,j$, $T4,j$, $T1,j+1$, $T2,j+1$, $T3,j+1$, $T4,j+1$, and a selection transistor ST whose drain terminal (D) is connected to the source terminal (S) of the floating gate transistor. The memory plane structure MA1 is similar to the memory plane structure described in the U.S. patent application Ser. No. 14/980,853, except that the respective state transistors $T1,j$, $T2,j$, $T3,j$, $T4,j$, $T1,j+1$, $T2,j+1$, $T3,j+1$, $T4,j+1$ are like the state transistor T described above and shown in FIGS. 1-3 and 5-6.

The memory cells $C1,j$, $C2,j$, $C3,j$, $C4,j$ belong to a column of rank j and the memory cells $C1,j+1$, $C2,j+1$, $C3,j+1$, $C4,j+1$ belong to an adjacent column of rank j+1. The memory cells $C1,j$, $C1,j+1$ belong to a first row of memory cells, or physical page PG1, and their floating gate transistors $T1,j$, $T1,j+1$ have control gates CG1 connected to a common gate control line CGL1. The memory cells $C2,j$, $C2,j+1$ belong to a second row of memory cells, or physical page PG2, and their floating gate transistors $T2,j$, $T2,j+1$ have control gates CG2 connected to a common gate control line CGL2. The memory cells $C3,j$, $C3,j+1$ belong to a third row of memory cells, or physical page PG3, and their floating gate transistors $T3,j$, $T3,j+1$ have control gates CG3 connected to a common gate control line CGL3. The memory cells $C4,j$, $C4,j+1$ belong to a fourth row of memory cells, or physical page PG4, and their floating gate transistors $T4,j$, $T4,j+1$ have control gates CG4 connected to a common gate control line CGL4.

In the column of rank j, the memory cells $C1,j$, $C2,j$ are twin memory cells and their selection transistors ST comprise a common selection gate CSG1,2 connected to a common word line WL1,2.

Similarly, the memory cells $C3,j$, $C4,j$ are twin memory cells and their selection transistors ST comprise a common selection gate CSG3,4 connected to a common word line WL3,4.

In the column of rank j+1, the memory cells $C2,j+1$, $C2,j+1$ are twin memory cells and their selection transistors ST comprise a common selection gate CSG1,2 connected to the word line WL1,2.

The memory cells $C3,j+1$, $C4,j+1$ are twin memory cells and their selection transistors ST comprise a common selection gate CSG3,4 connected to the common word line WL3,4.

The common selection gates CSG1,2 or CSG3,4 of the pairs of twin memory cells are buried vertical gates in the form of conducting trenches formed in the substrate, and the source terminals (S) of the selection transistors ST are connected to a buried source plane SL, running under the region of the substrate where the memory cells are implanted.

The memory plane MA1 comprises two bit lines per column of memory cells. Thus, two bit lines $B1,j$, $B2,j$ are assigned to the memory cells of the column of rank j, and two bit lines $B1,j+1$, $B2,j+1$ are assigned to the memory cells of the column of rank j+1.

Two twin memory cells are connected to different bit lines from either of the two bit lines assigned to the column in which they are located, whereas two memory cells being adjacent but non-twin are connected to the same bit line.

Thus, in the column of rank j:
the drain terminal (D) of the floating gate transistor $T1,j$ is connected to the bit line $B1,j$ via a conducting path 1A,
the drain terminal of the floating gate transistor $T2,j$ is connected to the bit line $B2,j$ via a conducting path 23B,
the drain terminal of the floating gate transistor $T3,j$ is connected to the bit line $B2,j$ via the conducting path 23B (the memory cell $C2,j$ being adjacent but non-twin to the memory cell $C3,j$), and
the drain terminal of the floating gate transistor $T4,j$ is connected to the bit line $B1,j$ via a conducting path 4A.

In the column of rank j+1:
the drain terminal of the floating gate transistor T1,j+1 is connected to the bit line B1,j+1 via a conducting path 1C,
the drain terminal of the floating gate transistor T2,j+1 is connected to the bit line B2,j+1 via a conducting path 23D,
the drain terminal of the floating gate transistor T3,j+1 is connected to the bit line B2,j+1 via the conducting path 23D (the memory cell C2,j+1 being adjacent but non-twin to the memory cell C3,j+1), and
the drain terminal of the floating gate transistor T4,j+1 is connected to the bit line B1,j+1 via a conducting path 4C.

Figure 8:
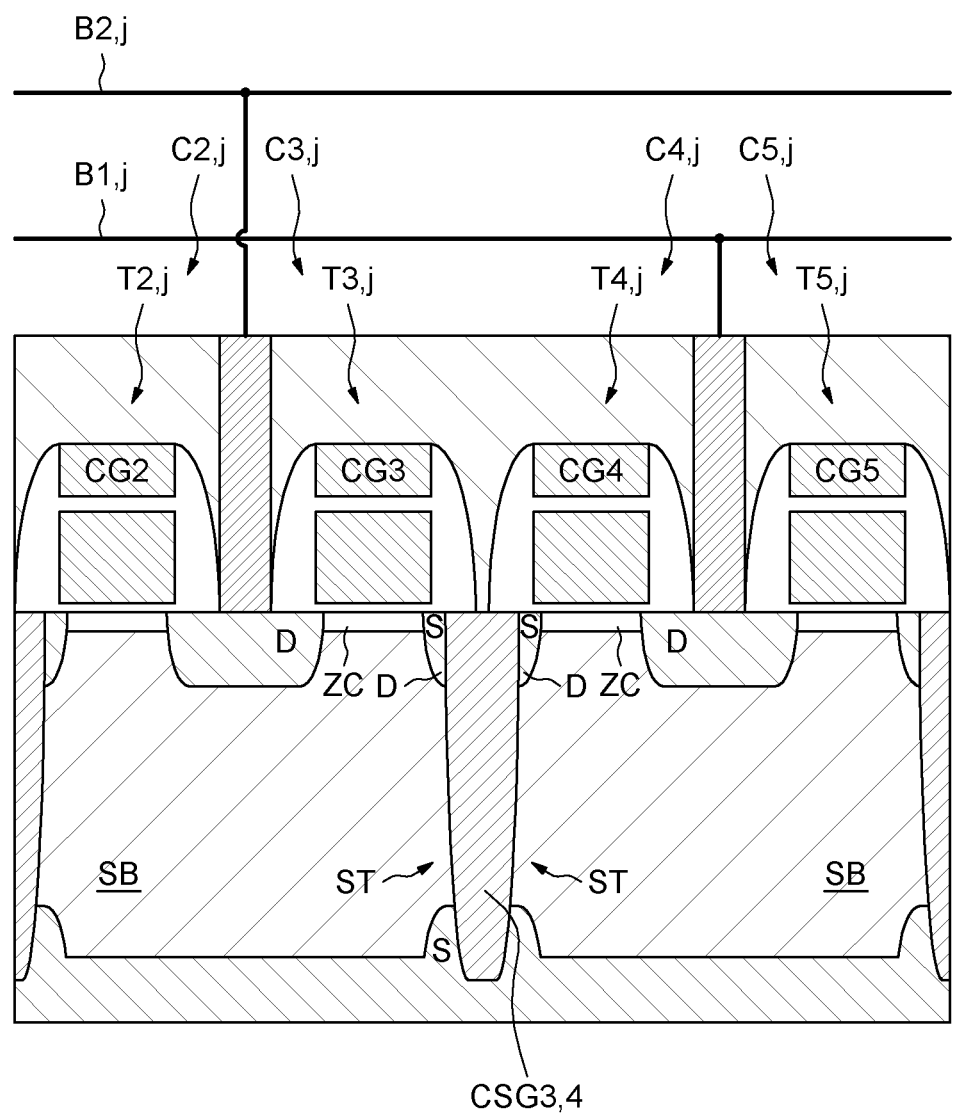

As illustrated in FIG. 8, each state transistor is here again a depletion-mode transistor with an implanted channel ZC. The selection transistors ST connected to the two state transistors T3,j and T4,j each have a vertical channel and a buried common vertical selection gate CSG3,4. For this reason, here again the implantation of the channel ZC of each state transistor T is not detrimental to the characteristics of each selection transistor. It should be noted that, for the sake of simplification of the figure, the contact allowing the buried common gate CSG3,4 to be connected to the corresponding word line is not shown.

Furthermore, each memory cell can be read independently of its twin memory cell by means of the bit line to which it is connected and to which its twin memory cell is not connected. For example, after selecting twin memory cells C1,j, C2,j by means of a selection voltage applied to the word line WL1,2, and after having applied a read voltage of zero to the gate control line CGL1, the memory cell C1,j can be read by means of the bit line B1,j without it being necessary to apply a negative read inhibit voltage to the gate control line CGL2 of the twin memory cell C2,j since this memory cell is not connected to the bit line B1,j but to the bit line B2,j.

Accordingly, a read voltage of zero can be applied to the control gates of the state transistors of all the memory cells of the memory plane.

Figure 9:
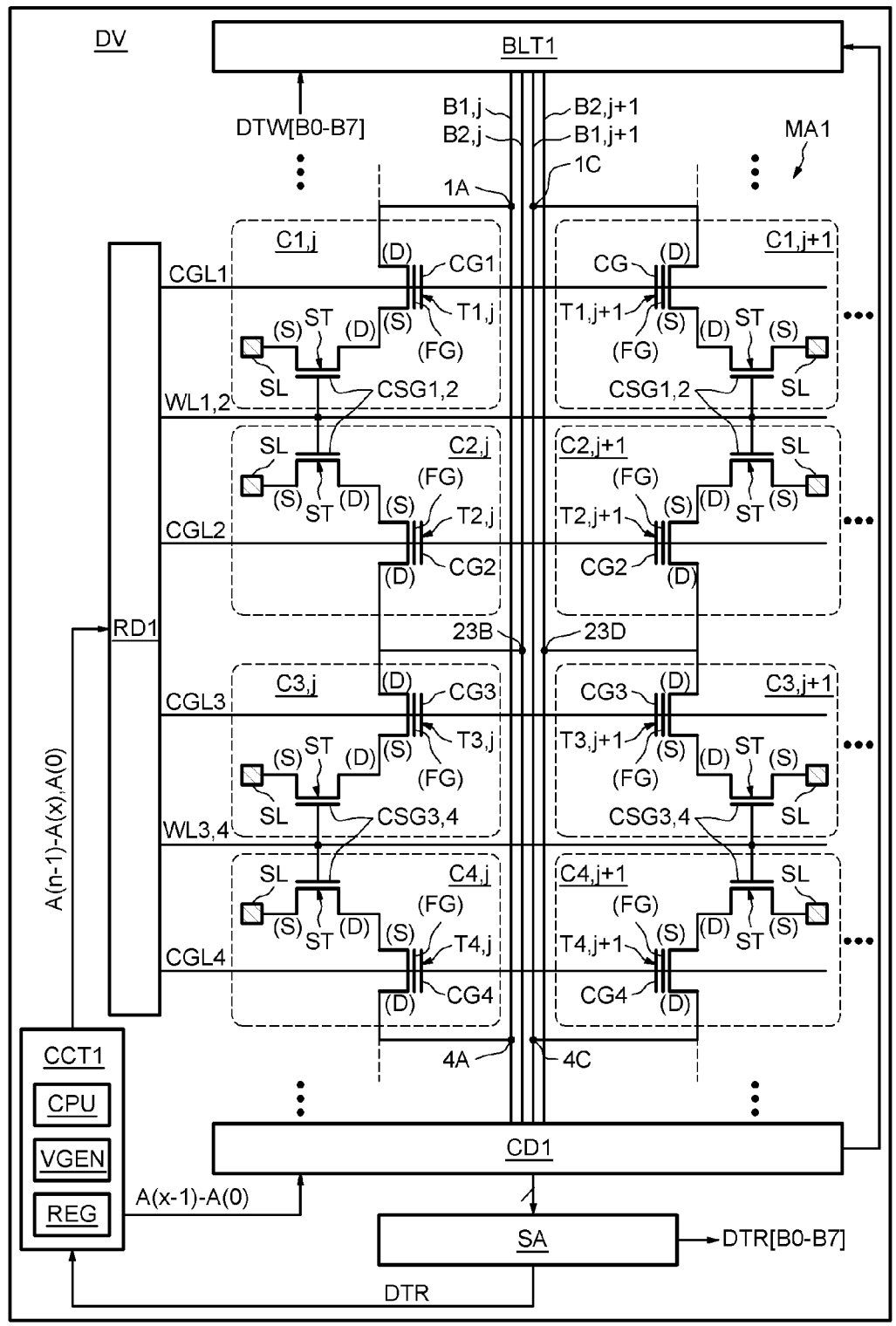

FIG. 9 is the electrical circuit diagram of an integrated memory device DV comprising the memory plane MA1 in FIG. 7. The device DV comprises a control circuit CCT1, a word line decoder RD1, a column decoder CD1, read amplifiers SA whose number is equal to the number of bits in a word to be read in the memory plane, for example a word of eight bits B0-B7, and programming latches BLT1 for applying voltages to the bit lines B1,j, B2,j, B1,j+1, B2,j+1, as a function of a word DTW to be written into the memory, for example a word of eight bits B0-B7.

The word line decoder RD1 controls the voltages applied to the gate control lines CGL1 to GL4 and to the word line WL1,2, WL2,3 as a function of a most significant address A(n−1)-A(x) of a word, or row address. The decoder CD1, in combination with the latches BLT1, controls the voltages applied to the bit lines B1,j, B2,j, B1,j+1, B2,j+1 as a function of a least significant address A(x−1)-A(0) of the word, or column address, the row and column addresses forming together the address A(n−1)-A0 of a word to be read or to be written in the memory plane. In read mode, the decoder CD1 connects the read amplifiers SA to the bit lines connected to the memory cells that are to be read, and the read amplifiers supply the word DTR.

The circuit CCT1 comprises for example a central processing unit CPU, a voltage generator VGEN, and address and data registers. It executes read and write commands, provides the control of the decoders, the supply of the voltages for the read and write operations (erase-programming), the supply of the most significant and least significant addresses to the decoders and may execute a program for refreshing the memory cells.

Owing to the presence of two bit lines per column, the word line decoder RD1 is configured so as to be able to control separately the voltages applied to the gate control lines of twin memory cells, either CGL1, CGL2 or CGL3, CGL3, which here have the same most significant address A(n−1)-A(x).

This separate control of the voltages may be reserved for the erase operations, so as to apply a positive voltage to these memory cells situated on a page which is the twin of that containing the memory cell or cells in the process of being erased.

In read mode, as indicated hereinbefore, the decoder can on the other hand apply, by connecting them to ground, the same voltage of zero to the twin gate control lines or even to all the gate control lines of the memory plane in order to reduce the read stress and to limit the switching operations of logic gates and hence to limit the electrical power consumption of the memory, because the selection of the memory cells to be read is implemented by means of the word lines WL.

In such an embodiment, the decoder RD1 receives, in addition to the most significant address A(n−1)-A(x) of a word, the least significant bit A(0) of the least significant address A(x−1)-A(0) of the word.

The decoder RD2 also receives, from the circuit CCT1, a data signal indicating to it whether the address decoding to be carried out is being applied in the process of reading, of erasing or of programming memory cells.

If the decoding is being applied in the framework of an erase operation, the decoder RD1 differentiates the two gate control lines as a function of the bit A(0). For example, the decoder RD1 selects the gate control line CGL1 if the bit line B1,j is designated by the complete address received by the memory, or selects the gate control line CGL2 if the bit line B2,j is designated by the complete address received by the memory. In one equivalent variant, the decoder may receive a signal from the column decoder CD1 indicating to it which of the two gate control lines needs to be selected. Those skilled in the art will naturally be able to provide other embodiments of the decoder, aimed for example at controlling separately the voltages applied to the gate control lines of twin memory cells in programming and erase phases.

Figure 10:
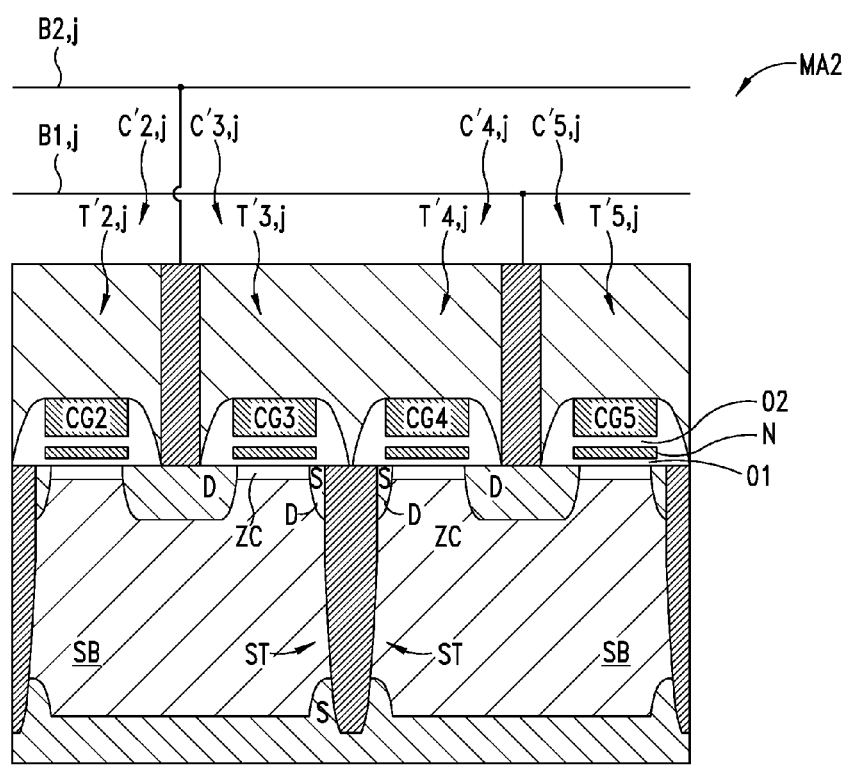

A portion of a memory plane MA2 according to another embodiment of the present disclosure is shown in FIG. 10. The arrangement in FIG. 10 is the same as the arrangement of FIG. 8 except that the memory plane MA2 includes memory cells C'2,j, C'3,j, C'4,j, and C'5,j that include respective state transistors T'2,j, T'3,j, T'4,j, and T'5,j that are SONOS (silicon-oxide-nitride-oxide-silicon) transistors. As illustrated in FIG. 10, each state transistor includes a poly-silicon control gate CG2, CG3, CG4, or CG5 that is formed on an ONO stack that includes a first silicon oxide layer O1, a silicon nitride layer N, and a second silicon oxide layer O2. As is known, the nitride layer N implements a charge-trapping region, like the floating gate of the floating gate state transistors T discussed above.

Like the state transistors T2,j, T3,j, T4,j, and T5,j in FIG. 8, each of the state transistors T'2,j, T'3,j, T'4,j, and T'5,j of FIG. 10 is again a depletion-mode transistor with an implanted channel ZC. The selection transistors ST connected to the two state transistors T'3,j and T'4,j each have a vertical channel and a buried common vertical selection gate CSG3,4. For this reason, here again the implantation of the channel ZC of each state transistor T'2,j, T'3,j, T'4,j, and T'5,j is not detrimental to the characteristics of each selection transistor. It should be noted that, for the sake of simplification of the figure, the contact allowing the buried common gate CSG3,4 to be connected to the corresponding word line is not shown.

Furthermore, each memory cell C'2,j, C'3,j, C'4,j, and C'5,j can be read independently of its twin memory cell by means of the bit line to which it is connected and to which its twin memory cell is not connected. For example, after selecting twin memory cells C'1,j, C'2,j by means of a selection voltage applied to the word line WL1,2, and after having applied a read voltage of zero to the gate control line CGL1, the memory cell C'1,j can be read by means of the bit line B1,j without it being necessary to apply a negative read inhibit voltage to the gate control line CGL2 of the twin memory cell C'2,j since this memory cell is not connected to the bit line B1,j but to the bit line B2,j. Accordingly, a read voltage of zero can be applied to the control gates of the state transistors of all the memory cells of the memory plane MA2.

Figure 11:
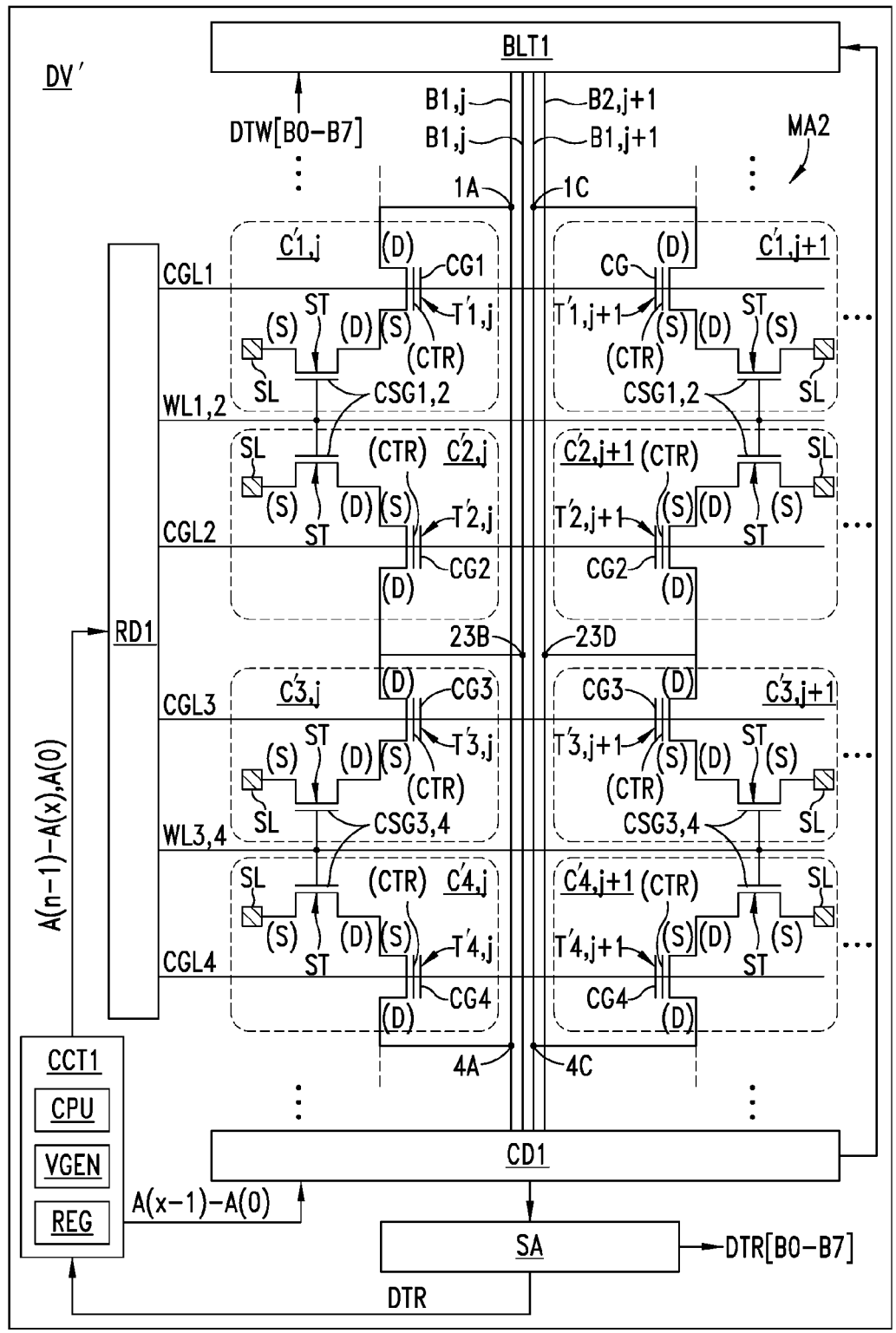

FIG. 11 is an electrical circuit diagram of an integrated memory device DV' comprising the memory plane MA2 in FIG. 10. The device DV' comprises the same control circuit CCT1, word line decoder RD1, column decoder CD1, read amplifiers, programming latches BLT1, control gate lines CGL1-CGL4, word lines WL1,2-WL3,4, and bit lines B1,j, B2,j, B1,j+1, and B2,j+1 as the memory device DV of FIG. 9, and operates the same as discussed above. FIG. 11 shows memory cells C'1,j, C'2,j, C'3,j, C'4,j having respective state transistors T'1,j, T'2,j, T'3,j, T'4,j. The charge trapping regions formed by the respective nitride layers of the state transistors T'1,j, T'2,j, T'3,j, T'4,j are labeled as (CTR).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A non-volatile memory device, comprising:
a first twin pair of memory cells, the first twin pair including first and second memory cells arranged in a first column, the first and second memory cells each including a respective selection transistor and a respective state transistor, the selection transistors of the first twin pair having respective gate terminals coupled to one another;
a second twin pair of memory cells, the second twin pair including third and fourth memory cells arranged in the first column, the third memory cell being adjacent to the second memory cell, the third and fourth memory cells each including a respective selection transistor and a respective state transistor, the selection transistors of the second twin pair having respective gate terminals coupled to one another;
a first bitline coupled to conduction terminals of the state transistors of the first and fourth memory cells; and
a second bitline coupled to conduction terminals of the state transistors of the second and third memory cells,
wherein each state transistor having a charge-trapping region and a control gate, the state transistor being configured to store a binary data value and selectively take first and second states respectively corresponding to two logical values of the binary data value, wherein the state transistor is a depletion-mode transistor and is configured, when a control voltage of zero is applied to the said control gate, to be conducting when the state transistor is in the first state and turned off when the state transistor is in the second state.

2. The non-volatile memory device of claim 1, wherein each state transistor is configured so as to be conducting when the state transistor is in a virgin state and when a control voltage of zero is applied to the control gate of the state transistor.

3. The non-volatile memory device according to claim 2, in which each state transistor is configured to have a negative threshold voltage when the state transistor is in a virgin state.

4. The non-volatile memory device according to claim 3, in which the negative threshold voltage is between −1 volt and −0.5 volts.

5. The non-volatile memory device according to claim 1, in which each state transistor has a channel implanted at a surface in a substrate.

6. The non-volatile memory device according to claim 5, in which the implanted channel has a depth that is less than or equal to 100 nm.

7. The non-volatile memory device according to claim 5, in which the channel has a dose of implanted dopants between $10^{12}$ atoms/cm$^2$ and $10^{14}$ atoms/cm$^2$.

8. The non-volatile memory device according to claim 1, further comprising a read circuit configured to apply a read voltage of zero on the control gate of the state transistor of each memory cell during an operation for reading the memory cell.

9. The device according to claim 1, in which each state transistor is a SONOS transistor in which the charge-trapping region includes a layer of silicon nitride between first and second silicon oxide layers.

10. The non-volatile memory device according to claim 1, comprising:
a third twin pair of memory cells, the third twin pair including fifth and sixth memory cells arranged in a second column, the fifth and sixth memory cells each including a respective selection transistor and a respective state transistor, the selection transistors of the third twin pair having respective gate terminals coupled to one another;
a fourth twin pair of memory cells, the fourth twin pair including seventh and eighth memory cells arranged in the second column, the seventh memory cell being adjacent to the sixth memory cell, the seventh and eighth memory cells each including a respective selection transistor and a respective state transistor, the selection transistors of the fourth twin pair having respective gate terminals coupled to one another;
a third bitline coupled to conduction terminals of the state transistors of the fifth and eighth memory cells; and
a fourth bitline coupled to conduction terminals of the state transistors of the sixth and seventh memory cells.

11. The non-volatile memory device according to claim 10, comprising:
a first gate control line coupled to the respective control gates of the state transistors of the first and fifth memory cells;
a second gate control line coupled to the respective control gates of the state transistors of the second and sixth memory cells;

a third gate control line coupled to the respective control gates of the state transistors of the third and seventh memory cells; and a fourth gate control line coupled to the respective control gates of the state transistors of the fourth and eighth memory cells.

12. A method, comprising:

reading a non-volatile memory cell of a memory device that includes a memory plane including rows and columns of memory cells and two bit lines per column, each column of memory cells including pairs of twin memory cells, each pair of twin memory cells having two selection transistors sharing a common gate, two adjacent twin memory cells of the same column not being connected to the same bit line, and two adjacent memory cells of the same column that are not part of the same twin memory cell being connected to the same bit line, each memory cell including a selectable state transistor that is a depletion-mode transistor having a charge trapping region and a control gate, wherein the reading includes applying a read voltage of zero to the control gate of the state transistor of the non-volatile memory cell being read.

13. The method according to claim 12, in which each state transistor is configured so as to have a negative threshold voltage when the state transistor is in a virgin state.

14. The method according to claim 12, comprising applying read voltage of zero to the control gates of the state transistors of all the memory cells of the memory plane.

15. The method according to claim 12, in which the memory cells of at least a part of each row form a page and the method includes reading the memory plane by page.

16. A non-volatile memory device, comprising:

a memory plane including rows and columns of memory cells, each memory cell including a selection transistor, having a control gate, and a selectable state transistor that is a depletion-mode transistor having a charge trapping region and a control gate, each column of memory cells including pairs of twin memory cells, the selection transistors of each pair of twin memory cells sharing a common gate;

a plurality of gate control lines, each control gate line being electrically coupled to the control gates of the state transistors of the memory cells of a respective one of the rows; and a plurality of bit lines, each column of memory cells being connected to a respective pair of bit lines of the plurality of bit lines, two adjacent twin memory cells of the same column not being connected to the same bit line, and two adjacent memory cells of the same column that are not part of the same twin memory cell being connected to the same bit line.

17. The non-volatile memory device according to claim 16, in which each state transistor is configured to have a negative threshold voltage when the state transistor is in a virgin state.

18. The device according to claim 1, in which each state transistor is a SONOS transistor in which the charge-trapping region includes a layer of silicon nitride between first and second silicon oxide layers.

19. The non-volatile memory device according to claim 1, wherein:

the columns include:
  a first column that includes first and second twin pairs of memory cells, the first twin pair including first and second memory cells, the second twin pair including third and fourth memory cells, and the third memory cell being adjacent to the second memory cell; and
  a second column that includes third and fourth twin pairs of memory cells, the third twin pair including fifth and sixth memory cells, the second twin pair including seventh and eighth memory cells, and the sixth memory cell being adjacent to the seventh memory cell; and the plurality of bitlines includes a first bitline coupled to conduction terminals of the state transistors of the first and fourth memory cells, a second bitline coupled to conduction terminals of the state transistors of the second and third memory cells, a third bitline coupled to conduction terminals of the state transistors of the fifth and eighth memory cells, and a fourth bitline coupled to conduction terminals of the state transistors of the sixth and seventh memory cells.

20. The non-volatile memory device according to claim 19, wherein the plurality of control gate lines includes:

a first gate control line coupled to the respective control gates of the state transistors of the first and fifth memory cells;

a second gate control line coupled to the respective control gates of the state transistors of the second and sixth memory cells;

a third gate control line coupled to the respective control gates of the state transistors of the third and seventh memory cells; and a fourth gate control line coupled to the respective control gates of the state transistors of the fourth and eighth memory cells.

* * * * *